United States Patent [19]

Sakai et al.

[11] Patent Number: 5,041,744
[45] Date of Patent: Aug. 20, 1991

[54] CHOPPER TYPE COMPARATOR

[75] Inventors: Hideo Sakai; Tomotaka Saito, both of Yokohama, Japan

[73] Assignee: Kabushiki Kaisha Toshiba, Kawasaki, Japan

[21] Appl. No.: 374,069

[22] Filed: Jun. 30, 1989

[30] Foreign Application Priority Data

Jul. 4, 1988 [JP] Japan ................... 63-166410

[51] Int. Cl.⁵ ................ H03K 19/003; H03K 5/24; H03K 17/16

[52] U.S. Cl. ................ 307/491; 307/355; 307/362; 307/443

[58] Field of Search ............ 307/355, 356, 362, 490, 307/491, 353, 443

[56] References Cited

U.S. PATENT DOCUMENTS 4,760,287  7/1988  Goto et al. ............ 307/356
4,845,383  7/1989  Iida ..................... 307/355

OTHER PUBLICATIONS

Kuboki et al., "Analysis and Evaluation of CMOS Chopper Type Comparator," The Transactions of the Institute of Electronics and Communication Engineers of Japan, vol. J67-C, No. 5, pp. 443-450, May 1984.

Primary Examiner—John Zazworsky
Attorney, Agent, or Firm—Finnegan, Henderson, Farabow, Garrett and Dunner

[57] ABSTRACT

The present invention provides a logic circuit comprising a first power terminal, a second power terminal set at a higher potential than the first power terminal, a first FET of a first conductivity having a current path coupled to the first power terminal, a second FET of a second conductivity having a current path coupled to the second power terminal, and an input terminal commonly coupled to gate terminals of the first and second FETs, the first FET and the second FET having a relationship expressed approximately by the following equation:

$$\frac{R_S}{R_D} = \sqrt{\left(\frac{W_P}{L_P} \Big/ \frac{W_N}{L_N}\right) \cdot \frac{\mu_P}{\mu_N}}$$

where $R_S$ is a resistance of a resistor element parasitically produced between the first power terminal and the current path of the first FET. $R_D$ is a resistance of a resistor element parasitically produced between the second power terminal and the current path of the second FET, $W_N$ is a channel width of the first FET, $W_P$ is a channel width of the second FET, $L_N$ is a channel length of the first FET, $L_P$ is a channel length of the second FET, $\mu_N$ is a first carrier mobility of the first FET, and $\mu_P$ is a second carrier mobility of the second FET.

20 Claims, 5 Drawing Sheets

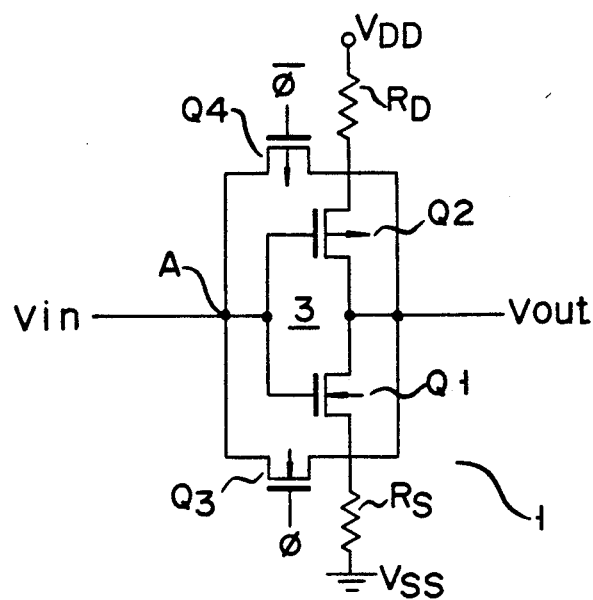
F I G. 1
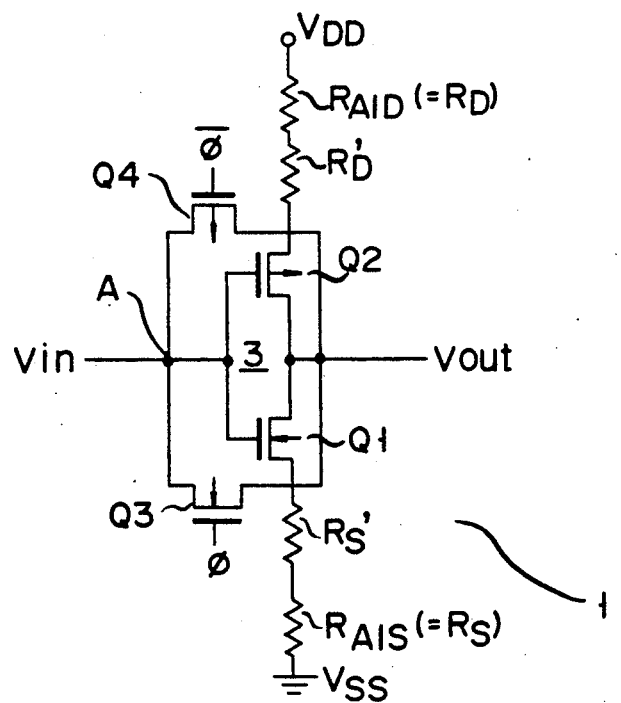
F I G. 2

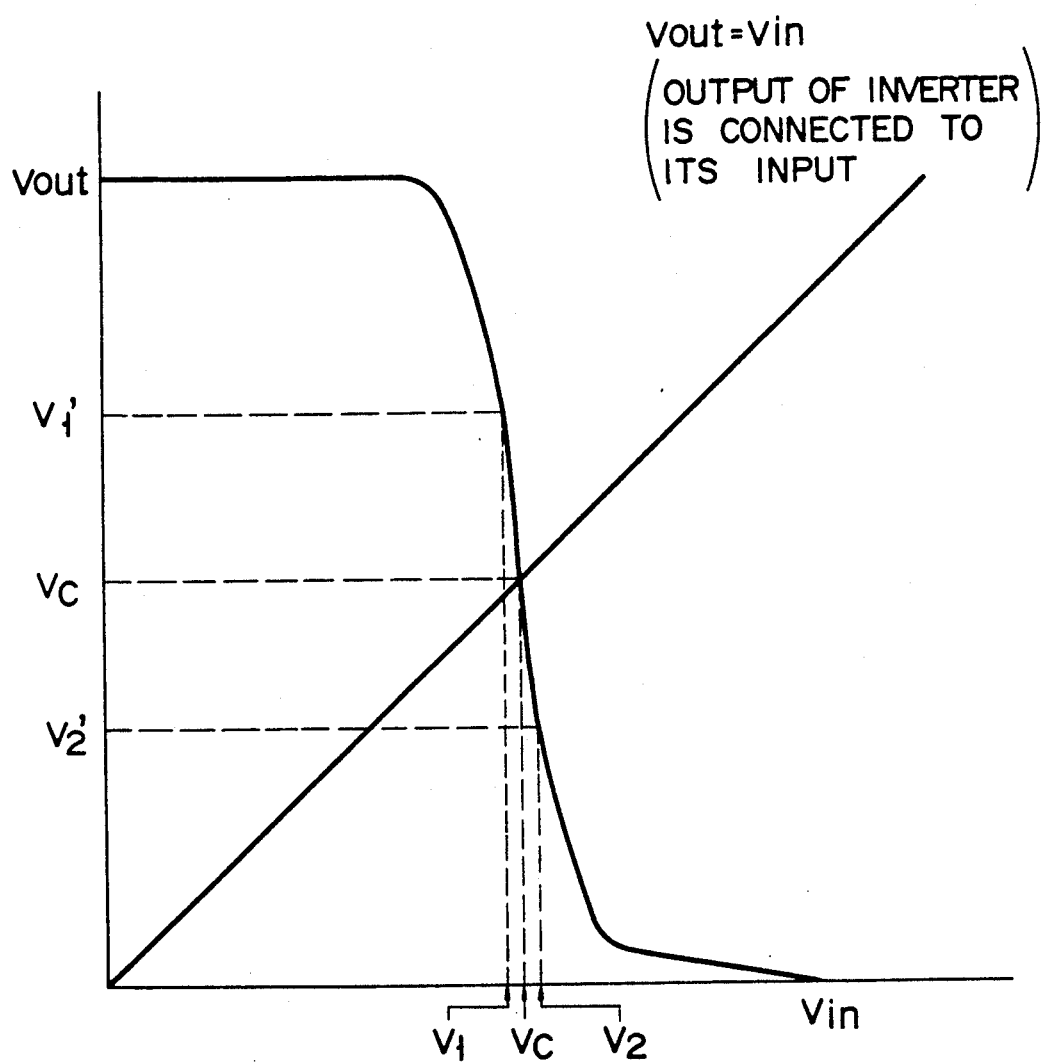
F I G. 4

CHOPPER TYPE COMPARATOR

BACKGROUND OF THE INVENTION

1. Field of the Invention

The present invention relates to an inverter and a chopper type comparator using the same, and, more particularly, to a technique of making the layout of a power source of an analog circuit in a semiconductor integrated circuit and setting a circuit constant.

2. Description of the Related Art

A description will be given below of a chopper type comparator for typical use in conventional A/D comparators. FIG. 3 exemplifies the use of a chopper type comparator. In this diagram, reference numeral 1 denotes the main part of a chopper type comparator, reference numeral 2 a sample and hold circuit of the comparator, $Q_1$ and $Q_2$ N and P channel field effect transistors (IG-FET) which constitute an inverter 3, $Q_3$ and $Q_4$ feedback switching transistors, $V_{DD}$ and $V_{SS}$ power sources, C a capacitor, SW1 and SW2 switches whose switching operations are controlled by signals $\phi$ and $\bar{\phi}$, $V_{ref}$ a reference voltage, and $A_{in}$ a comparator input.

Referring to FIG. 3, the switch SW1 on the $A_{in}$ side and the feedback switches $Q_3$, $Q_4$ of the inverter 3 are turned ON to accumulate charges in the capacitor C. Since the inverter 3 has its input and output short-circuited at this time, the potential at the point A equals a threshold value $V_C$ of the inverter 3. The charges Q accumulated in the capacitor C can therefore be given by:

$$Q = (V_C - A_{in}) C \quad (1)$$

Then, the switches SW1, $Q_3$ and $Q_4$ are turned OFF and the switch SW2 on the $V_{ref}$ side is turned ON. As the amount of charges accumulated in the capacitor C does not vary, with $V_A$ being the potential of the point A, the following can be derived:

$$Q = (V_A - V_{ref}) C \quad (2)$$

From equations (1) and (2), we can attain:

$$V_A = V_C + (V_{ref} - A_{in}) \quad (3)$$

FIG. 4 illustrates the input-output characteristic of a typical inverter. The point where the linear line $V_{in} = V_{out}$ intersects the characteristic curve is the threshold value $V_C$ of the inverter. From this diagram, it is understood that when an input voltage is off $V_C$, even slightly, this deviation will appear in amplified manner in the output. That is, $$V_1' - V_C = \alpha_1 (V_C - V_1)$$

$$V_C - V_2' = \alpha_2 (V_2 - V_C)$$

where $\alpha_1$ and $\alpha_2$ are amplification factors of the inverter 3.

From the equation (3), therefore, if $A_{in}$ is smaller than $V_{ref}$, the output $V_{A1}$ (= $V_{out}$) of the comparator would be:

$$V_{A1} = V_C + \alpha_1 (V_{ref} - A_{in})$$
$$\alpha_1 > 1,$$

and if $A_{in}$ is greater than $V_{ref}$, the output $V_{A2}$ (= $V_{out}$) of the comparator would be:

$$V_{A2} = V_C + \alpha_2 (V_{ref} - A_{in})$$
$$\alpha_2 > 1.$$

The conventional comparators should be concerned with an offset initiated by the resistors in the power sources because of the following reason. As the input of the inverter 3 is at the middle level at the sampling time (at which charges are being accumulated in the capacitor C with SW1, $Q_3$ and $Q_4$ all being ON), the P and N type transistors $Q_2$ and $Q_1$ of the inverter are both turned ON to thereby permit a through current to flow between the power sources $V_{DD}$ and $V_{SS}$. Given that $I_p$ is the through current at that time and $R_S$ and $R_D$ are a source resistor of the inverter on the side of the reference power source ($V_{SS}$) and a source resistor on the side of the supplying power source ($V_{DD}$), respectively, the potential on the $V_{SS}$ side increases by $I_p R_S$ while the potential on the $V_{DD}$ side falls by $I_p R_D$. The threshold value $V_C$ at this time can be given by:

$$V_C = \frac{\beta_N V_{TN} + \beta_P\{(V_{DD} - I_p R_D) - I_p R_S - |V_{TP}|\}}{\beta_N + \beta_P} + I_p R_S \quad (5)$$

$$\frac{\beta_N V_{TN} + \beta_P (V_{DD} - |V_{TP}|) + I_p(\beta_N R_S - \beta_P R_D)}{\beta_N + \beta_P}$$

$$\beta_N \equiv \sqrt{\frac{W_N}{2L_N} \cdot \frac{E_{OX}}{t_{OX}} \mu_N} \quad , \quad \beta_P \equiv \sqrt{\frac{W_P}{2L_P} \cdot \frac{E_{OX}}{t_{OX}} \mu_N}$$

where $V_{TN}$ and $V_{TP}$ are the threshold voltages of N and P type transistors, respectively, $L_N$ and $W_N$ are the channel length and width of the N type transistor, $L_p$ and $W_p$ are the channel length and width of the P type transistor, $\mu_N$ and $\mu_p$ are the mobilities of electrons and holes, and $E_{OX}$ and $t_{OX}$ are the dielectric constant and thickness of a gate oxide film.

When the operation enters a comparing period (unlike in the sampling time, only SW2 being turned ON), the input potential of the inverter varies from $V_C$, thus causing the through current to become to $I_p'$. The threshold value $V_C'$ at this time is $$V_{C'} = \frac{\beta_N V_{TN} + \beta_P(V_{DD} - |V_{TP}|) + I_P'(\beta_N R_S - \beta_P R_D)}{\beta_N + \beta_P} \quad (6)$$

From the equations (5) and (6) it should be understood that $V_C$ and $V_C'$ have the following relationship:

$$V_{C'} = V_C + \Delta V$$

$$\Delta V = \frac{(I_p - I_p')(\beta_N R_S - \beta_P R_D)}{\beta_N + \beta_P}$$

Therefore, the actual charges Q' accumulated in the capacitor C at the sampling time is $$Q' = (V_C + \Delta V - A_{in}) C.$$

From this equation, the potential $V_A$ at the point A at the time a comparison is made will be $$V_A = V_C + (V_{ref} - A_{in}) + \Delta V \quad (7)$$

Comparing the equation (3) with the equation (7) shows that an offset of $\Delta V$ occurs according to the prior art.

To reduce the offset originated from the resistors of power sources, efforts have been made to make the resistances of these resistors as small as possible. This has resulted in thick power wires, which causes larger chip size. Minimizing the resistances also restricts the location of the comparator.

SUMMARY OF THE INVENTION

Accordingly, it is an object of this invention to reduce or eliminate a variation in threshold value of an inverter originated from the resistors of power sources of a circuit.

The present invention provides a logic circuit comprising first power terminal ($V_{SS}$); a second power terminal ($V_{DD}$) set at a higher potential than the first power terminal ($V_{SS}$); a first FET ($Q_1$) of a first conductivity having a current path coupled to the first power terminal ($V_{SS}$); a second FET ($Q_2$) of a second conductivity having a current path coupled to the second power terminal ($V_{DD}$); and an input terminal commonly coupled to gate terminals of the first and second FETs ($Q_1$, $Q_2$), the first FET ($Q_1$) and the second FET ($Q_2$) having a relationship expressed approximately by the following equation:

$$\frac{R_S}{R_D} = \sqrt{\left(\frac{W_p}{L_p} \Big/ \frac{W_N}{L_N}\right) \cdot \frac{\mu_p}{\mu_N}} \quad (8)$$

where $R_S$ is a resistance of a resistor element parasitically produced between the first power terminal ($V_{SS}$) and the current path of the first FET ($Q_1$), $R_D$ is a resistance of a resistor element parasitically produced between the second power terminal ($V_{DD}$) and the current path of the second FET ($Q_2$), $W_N$ is a channel width of the first FET ($Q_1$), $W_p$ is a channel width of the second FET ($Q_2$), $L_N$ is a channel length of the first FET ($Q_1$), $L_p$ is a channel length of the second FET ($Q_2$), $\mu_N$ is a first carrier mobility of the first FET ($Q_1$), and $\mu_p$ is a second carrier mobility of the second FET ($Q_2$).

The variation in threshold value in an inverter which does not embody this invention is caused by the offset $\Delta V$, and is originated from the term $I_P(\beta_N R_S - \beta_p R_D)$ in the aforementioned equation (5) which is a variation in threshold value of the inverter. If the following is satisfied in this term, therefore, $$\beta_N R_S = \beta_p R_D \quad (9)$$

the offset $\Delta V$ would become zero, and the variation in threshold would be also zero as a consequence.

In other words, this invention is characterized in that, paying attention to the source resistors on the $V_{DD}$ and $V_{SS}$ sides to which no consideration has conventionally been given, the resistances of these resistors and the circuit constant of the inverter are made to have the relationship given by the equation (8). In the case of a chopper type comparator, for instance, since the threshold value does not vary, $\Delta V$ in the equation (7) is 0 V, thus eliminating a $\Delta V$-originated offset.

BRIEF DESCRIPTION OF THE DRAWINGS

FIG. 1 is a circuit diagram illustrating one embodiment of this invention;

FIG. 2 is a circuit diagram illustrating another embodiment of this invention;

FIG. 4 is a diagram illustrating the input-output signal characteristic of an inverter;

DETAILED DESCRIPTION OF THE PREFERRED EMBODIMENTS

Figure 3:
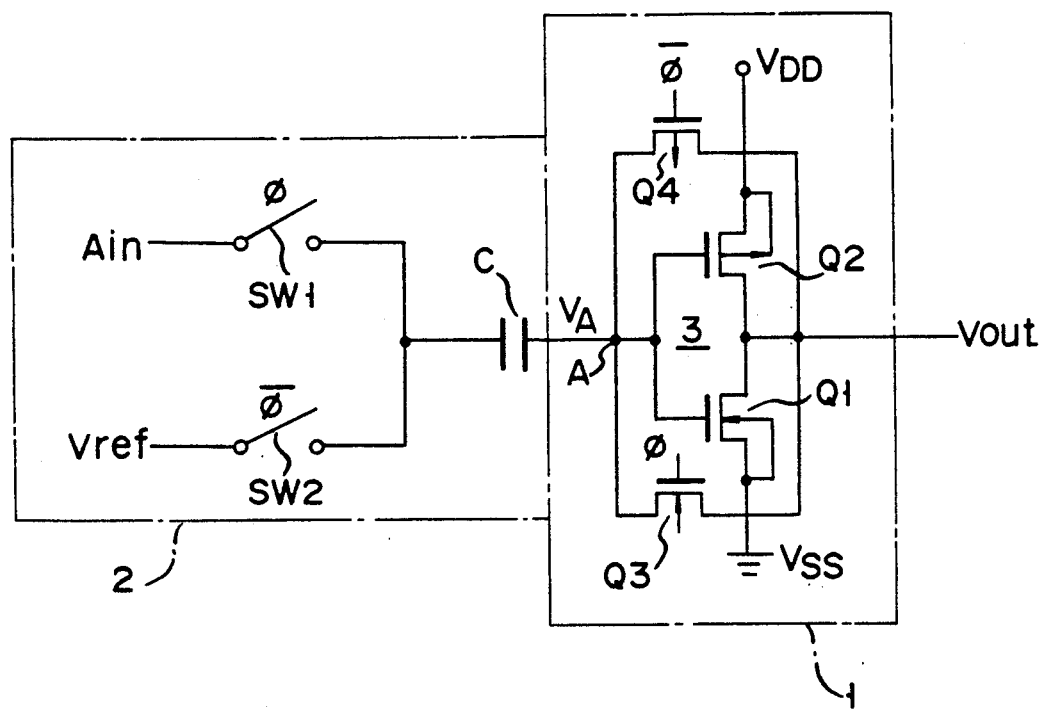
FIG. 3 is a circuit diagram for explaining an example to which this invention is not applied.

On embodiment of this invention will now be described referring to the accompanying drawings. FIG. 1 illustrates a circuit according to this embodiment in comparison with the one shown in FIG. 3, with only the main part of a chopper type comparator being illustrated. For the purpose of comparison and ease of understanding, the same reference numerals as shown in FIG. 3 are used in FIG. 1 to specify the identical or corresponding elements. $R_D$ and $R_S$ specify, as mentioned earlier, the wiring resistances of power sources $V_{DD}$ and $V_{SS}$, and these resistances are set from the circuit constant of the inverter 3 to satisfy the equation (8). If $R_D$ and $R_S$ are known in advance, the circuit constant of the inverter 3 should be altered to satisfy the equation (8).

In other words, if there is the relationship of the equation (9) satisfied in $I_p(\beta_N R_S - \beta_p R_D)$ in the equation (5), a variation in threshold value, the threshold values $R_S$ and $R_D$ and the circuit constant of the inverter 3 need only to have the relation of the equation (8), i.e., $$\frac{R_S}{R_D} = \sqrt{\left(\frac{W_P}{L_P} \Big/ \frac{W_N}{L_N}\right) \cdot \frac{\mu_P}{\mu_N}}$$

The following is an example of parameters satisfying these equations (5) and (8). The first channel length $L_N$ of the first FET $Q_1$ is 2.4 $\mu$m, the first channel width $W_N$ thereof 6.2 $\mu$m, and the first carrier mobility $W_N$ 200 cm$^2$/V.sec. With regard to the second FET $Q_2$, the second channel length $L_p$ is 2.4 $\mu$m, the second channel width $W_p$ 14.1 $\mu$m, and the second carrier mobility up 85 cm$^2$/V.sec.

Of these parameters, the first channel length $L_N$ and the first channel width $W_N$ of the first FET $Q_1$ should preferably be 1.2 $\mu$m to 100 $\mu$m, and so should the second channel length $L_P$ and second channel width $W_P$ of the second FET $Q_2$.

Such simple means can eliminate a variation in threshold value of the inverter 3 to thereby eliminate an offset originated from the source resistors. This can be achieved irrespective of the resistances of the source resistors, which does not therefore restrict the location of the comparator so much. Further, the wires of the power sources need not be made thick, thus preventing the chip size to be undesirably increased.

FIG. 2 illustrates another embodiment of this invention in which in addition to wiring resistors $R_{A1D}$ and $R_{A1S}$ (equivalent to $R_S$ and $R_D$, respectively) of aluminum higher resistors $R_D'$ and $R_S'$ are inserted in the circuit. If the values of $R_D'$ and $R_S'$ are set to make $R_{A1S}$ and $R_{A1D}$ negligible, the circuit constant can be determined only from $R_D'$ and $R_S'$.

In other words, given that $R_{A1D}, R_{A1S} << R_D', R_S'$, $$\frac{R_S' + R_{A1S}}{R_D' + R_{A1D}} = \frac{R_S}{R_D}.$$

In this case, the aforementioned parameters need only be set to satisfy $$\frac{R_S'}{R_D'} = \sqrt{\left(\frac{W_p}{L_p} \bigg/ \frac{W_N}{L_N}\right) \cdot \frac{\mu_p}{\mu_N}}$$

as per the first embodiment.

Different influences will be exerted on fabrication of a semiconductor device depending on which of the parameters, the channel lengths ($L_N$, $L_p$) of the two FETs, their channel widths ($W_N$, $W_p$) or the resistances ($R_S$, $R_D$) of the source electrodes, should be adjusted in realizing the above equation.

Figure 5:
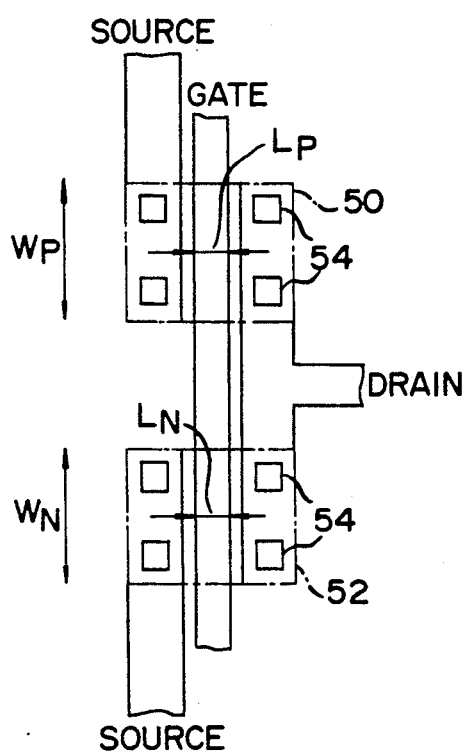
FIG. 5 is a diagram illustrating transistors embodying this invention with the same channel width and the same channel length.

FIG. 5 illustrates transistors embodying this invention which have the same channel width and the same channel length; reference numeral 50 denotes a P-type diffusion, 52 an N-type diffusion, and 54 contact holes. If the equality is realized by the resistances $R_S$, $R_D$ of the source electrodes while making the channel lengths $L_N$, $L_p$ and the channel widths $W_N$, $W_p$ fixed as shown in FIG. 5, regular channel lengths and channel widths can be maintained, thus ensuring a uniform shape of the device. This produces such a merit that there would be no variation in fabricated semiconductor devices which is inevitably caused by altering the channel lengths $L_N$, $L_p$ and channel widths $W_N$, $W_p$, and an error in characteristic of the devices is not therefore likely to occur. In addition, the circuit area of the semiconductor device will not be increased, making it possible to realize a higher integration of the device. The resistances $R_S$, $R_D$ of the source electrodes may be adjusted by using a resistor made of polysilicon, etc.

Figure 6:
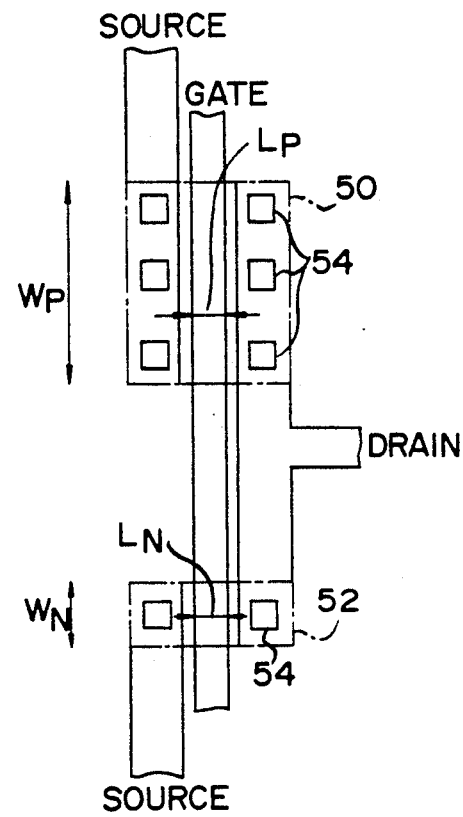
FIG. 6 is a diagram illustrating transistors embodying this invention with different channel widths and the same channel length.

FIG. 6 illustrates transistors embodying this invention which have different channel widths but the same channel length; reference numeral 50 denotes a P-type diffusion, 52 an N-type diffusion, and 54 contact holes. The equality of this invention may be realized by altering the channel widths $W_N$, $W_p$ while setting the channel lengths $L_N$, $L_p$ equal to each other, as shown in FIG. 6. Employing the same channel length for $L_N$, $L_p$ throughout the device ensures alignment of this invention without causing a variation in electric characteristic of the overall device. In addition, designing the pattern of a semiconductor device in this case is easier than the one involved in a case where the channel widths $W_N$, $W_p$ are altered.

Figure 7:
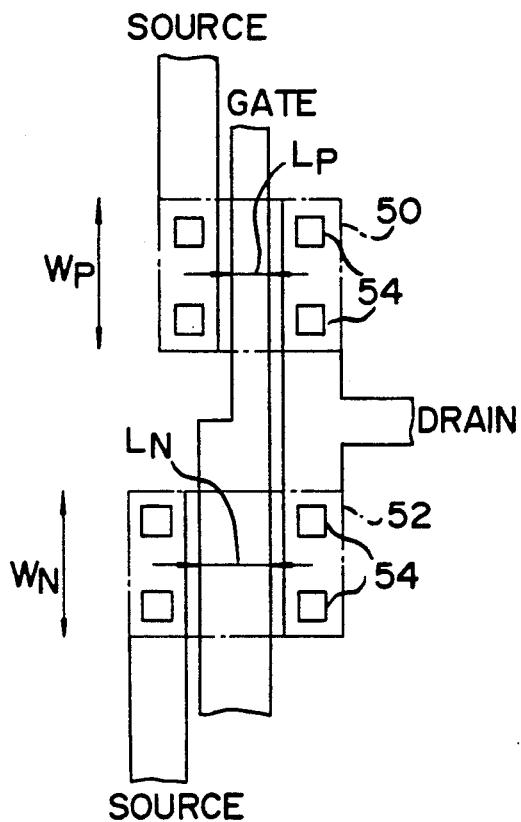
FIG. 7 is a diagram illustrating transistors embodying this invention with the same channel width and different channel lengths.

FIG. 7 illustrates transistors embodying this invention which have the same channel width but different channel lengths; reference numeral 50 denotes a P-type diffusion, 52 an N-type diffusion, and 54 contact holes. The equality of this invention may be realized by altering the channel lengths $L_N$, $L_p$ while setting the channel widths $W_N$, $W_p$ equal to each other, as shown in FIG. 7.

Figure 8:
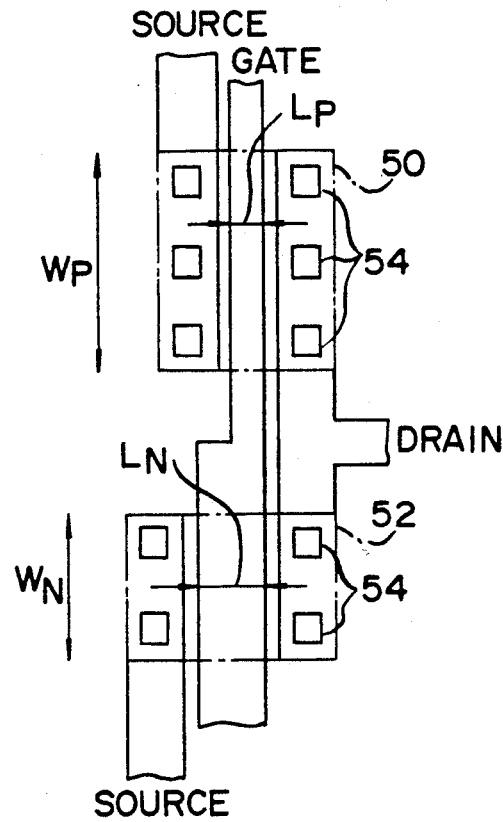
FIG. 8 is a diagram illustrating transistors embodying this invention with different channel widths and different channel lengths.

FIG. 8 illustrates transistors embodying this invention which have different channel widths and different channel lengths; reference numeral 50 denotes a P-type diffusion, 52 an N-type diffusion, and 54 contact holes. The equality of this invention may be realized by altering both the channel widths $W_N$, $W_p$ and the channel lengths $L_N$, $L_P$, as shown in FIG. 8.

Of course, this invention is in no way restricted to the above-described particular embodiments, but may be modified in various manners. For instance, although the foregoing description has been given mainly with reference to a chopper type comparator, this invention can also be applied to an inverter being used as an amplifier.

As described above, according to this invention, a variation in threshold value of an inverter can be eliminated by simple means, so that an offset originated from the resistors of power sources can easily be eliminated. In addition, since the elimination of the offset can be realized irrespective of the values of the source resistors, no restriction will be made on the location of the comparator. Further, the wires of the power sources need not be made particularly thick, thus preventing the chip size from being undesirably increased.

What is claimed is:

1. A logic circuit comprising:
   a first power terminal;
   a second power terminal set at a higher potential than said first power terminal;
   a first FET of a first conductivity having a current path coupled to said first power terminal;
   a second FET of a second conductivity having a current path coupled to said second power terminal; and
   an input terminal commonly coupled to gate terminals of said first and second FETs,
   said first FET and said second FET having a relationship expressed approximately by the following equation:

$$\frac{R_S}{R_D} = \sqrt{\left(\frac{W_P}{L_P} \bigg/ \frac{W_N}{L_N}\right) \cdot \frac{\mu_P}{\mu_N}}$$

where $R_S$ is a resistance of a resistor element parasitically produced between said first power terminal and said current path of said first FET,
$R_D$ is a resistance of a resistor element parasitically produced between said second power terminal and said current path of said second FET,
$W_N$ is a channel width of said first FET,
$W_p$ is a channel width of said second FET,
$L_N$ is a channel length of said first FET,
$L_p$ is a channel length of said second FET,
$\mu_N$ is a mobility of a first carrier of said first FET, and
$\mu_p$ is a mobility of a second carrier of said second FET.

2. A logic circuit according to claim 1, wherein said first channel length equals said second channel length, and said first channel width equals said second channel width.

3. A logic circuit according to claim 1, wherein said first channel length equals said second channel length.

4. A logic circuit according to claim 1, wherein said first channel width equals said second channel width.

5. A logic circuit according to claim 1, wherein said first channel length differs from said second channel length, and said first channel width differs from said second channel width.

6. A logic circuit according to claim 1, wherein said first channel length of said first FET is in a range from 1.2 $\mu$m to 100.0 $\mu$m.

7. A logic circuit according to claim 1, wherein said first channel width of said first FET is in a range from 1.2 $\mu$m to 100.0 $\mu$m.

8. A logic circuit according to claim 1, wherein said second channel length of said second FET is in a range from 1.2 $\mu$m to 100.0 $\mu$m.

9. A logic circuit according to claim 1, wherein said second channel width of said second FET is in a range from 1.2 $\mu$m to 100.0 $\mu$m.

10. A logic circuit comprising:
a first power terminal;
a second power terminal set at a higher potential than said first power terminal;
a first FET of a first conductivity having a current path coupled to said first power terminal;
a second FET of a second conductivity having a current path coupled to said second power terminal;
an input terminal commonly coupled to gate terminals of said first and second FETs;
a capacitor having one end commonly coupled to said gate terminals of said first and second FETs;
a first switch having one end coupled to said capacitor and an other end supplied with a signal to be detected; and
a second switch having one end coupled to said capacitor and a other end applied with a reference voltage,
said first FET and said second FET having a relationship expressed approximately by the following equation:

$$\frac{R_S}{R_D} = \sqrt{\left(\frac{W_P}{L_P} \middle/ \frac{W_N}{L_N}\right) \cdot \frac{\mu_P}{\mu_N}}$$

where $R_S$ is a resistor element parasitically produced in said first power terminal,
$R_D$ is a resistance of a resistor element parasitically produced in said second power terminal,
$W_N$ is a channel width of said first FET,
$W_P$ is a channel width of said second FET,
$L_N$ is a channel length of said first FET,
$L_P$ is a channel length of said second FET,
$\mu_N$ is a mobility of a first carrier of said first FET, and
$\mu_P$ is a mobility of a second carrier of said second FET.

11. A logic circuit according to claim 10, wherein said first channel length equals said second channel length, and said first channel width equals said second channel width.

12. A logic circuit according to claim 10, wherein said first channel length equals said second channel length.

13. A logic circuit according to claim 10, wherein said first channel width equals said second channel width.

14. A logic circuit according to claim 10, wherein said first channel length differs from said second channel length, and said first channel width differs from said second channel width.

15. A logic circuit according to claim 10, wherein said first channel length of said first FET is in a range from 1.2 $\mu$m to 100.0 $\mu$m.

16. A logic circuit according to claim 10, wherein said first channel width of said first FET is in a range from 1.2 $\mu$m to 100.0 $\mu$m.

17. A logic circuit according to claim 10, wherein said second channel length of said second FET is in a range from 1.2 $\mu$m to 100.0 $\mu$m.

18. A logic circuit according to claim 10, wherein said second channel width of said second FET is in a range from 1.2 $\mu$m to 100.0 $\mu$m.

19. A logic circuit comprising:
a first insulating gate field effect transistor (IG-FET) having a first conductivity type;
a second insulating gate field effect transistor (IG-FET) having a second conductivity type;
a first power terminal coupled to a source electrode of said first IG-FET;
a second power terminal coupled to a source electrode of said IG-FET; and
an input terminal being commonly coupled gate electrodes of said first and second IG-FETs;
wherein the following relationship is approximately satisfied:

$$\frac{R_S}{R_D} = \sqrt{\left(\frac{W_P}{L_P} \middle/ \frac{W_N}{L_N}\right) \cdot \frac{\mu_P}{\mu_N}}$$

where $L_N$ denotes a channel length; $W_N$ denotes a channel width of said first IG-FET; $L_p$ denotes a channel length; $W_p$ denotes a channel width of said second IG-FET; $R_S$ denotes a wiring resistance of said first power terminal; $R_D$ denotes a wiring resistance of said second power terminal; $\mu_N$ denotes a mobility of carriers of said first IG-FET; and $\mu_P$ denotes a mobility of carrier of said second IG-FET.

20. A logic circuit according to claim 19, further comprising switch means, coupled to said input terminal of said logic circuit, said switch means being opened and closed according to a sampling time of a comparison input signal and a time of comparing said comparison input signal with a reference voltage to thereby supply a voltage corresponding to a difference between said comparison input signal and said reference voltage to said input terminal of said logic circuit.

* * * * *